(12) United States Patent
Zhao et al.

(10) Patent No.: US 10,971,042 B2
(45) Date of Patent: Apr. 6, 2021

(54) RELIABILITY TEST FIXTURE FOR FLEXIBLE DISPLAY COMPONENT AND ONLINE RELIABILITY TEST DEVICE FOR FLEXIBLE DISPLAY COMPONENT

(71) Applicant: Kunshan New Flat Panel Disp. Tech. Center Co., Ltd, Kunshan (CN)

(72) Inventors: Jingxun Zhao, Kunshan (CN); Sheng Gao, Kunshan (CN); Bo Yuan, Kunshan (CN); Xiuqi Huang, Kunshan (CN)

(73) Assignee: Kunshan New Flat Panel Disp. Tech. Center Co., Ltd, Kunshan (CN)

( * ) Notice: Subject to any disclaimer, the term of this patent is extended or adjusted under 35 U.S.C. 154(b) by 240 days.

(21) Appl. No.: 15/781,604

(22) PCT Filed: Dec. 2, 2016

(86) PCT No.: PCT/CN2016/108387
§ 371 (c)(1),
(2) Date: Jun. 5, 2018

(87) PCT Pub. No.: WO2017/107755
PCT Pub. Date: Jun. 29, 2017

(65) Prior Publication Data
US 2020/0202757 A1   Jun. 25, 2020

(30) Foreign Application Priority Data

Dec. 24, 2015   (CN) .................... 201510991421 .X

(51) Int. Cl.
*G01R 31/02* (2006.01)
*G09G 3/00* (2006.01)
(Continued)

(52) U.S. Cl.
CPC ........... *G09G 3/006* (2013.01); *G01R 31/282* (2013.01); *G06F 1/1652* (2013.01); *G09G 2380/02* (2013.01)

(58) Field of Classification Search
CPC .............. G01R 31/003; G01R 31/2642; G01R 31/2808; G01R 31/2831; G01R 31/2881;
(Continued)

(56) References Cited

U.S. PATENT DOCUMENTS

| 7,181,979 B1 | 2/2007 | Lin et al. | |
| 8,461,860 B2 * | 6/2013 | Kim ...................... | G01M 5/005 324/762.01 |

(Continued)

FOREIGN PATENT DOCUMENTS

| CN | 1963428 | 5/2007 |
| CN | 101033935 A | 9/2007 |

(Continued)

OTHER PUBLICATIONS

Makoto Noda, et al., 47.3: A Rollable AM-OLED Display Driven by OTFTs, 2010, 4 pages.
(Continued)

*Primary Examiner* — Minh N Tang
(74) *Attorney, Agent, or Firm* — Seyfarth Shaw LLP

(57) ABSTRACT

Disclosed are a reliability test fixture and an online test device for a flexible display component. The fixture comprises a support and a rotating shaft rotatably mounted on the support. An engagement recess for fixing a flexible display component is provided in an axial direction on the surface of the rotating shaft. A test module used to detect an electrical parameter of an internal circuit of the flexible display component is disposed inside the rotating shaft. The test module has a test contact for electrically connecting to the flexible display component. During a test, the flexible dis-
(Continued)

play component is fixed in the engagement recess and is electrically connected to the test module.

14 Claims, 1 Drawing Sheet

(51) Int. Cl.
*G01R 31/28* (2006.01)
*G06F 1/16* (2006.01)

(58) Field of Classification Search
CPC .............. G01R 31/2887; G01R 1/0475; G01M 5/0033; G01M 5/0075; G01M 5/0083; G01N 3/20; G09F 9/00; G09F 9/301; G09F 11/29; G09F 11/30
See application file for complete search history.

(56) References Cited

U.S. PATENT DOCUMENTS

| | | | |
|---|---|---|---|
| 2002/0196205 A1* | 12/2002 | Yamakado | H01L 27/3293 345/33 |
| 2011/0248739 A1 | 10/2011 | Kim et al. | |
| 2014/0253160 A1 | 9/2014 | Brunner | |
| 2015/0033870 A1 | 2/2015 | Lee | |
| 2017/0060183 A1* | 3/2017 | Zhang | H01L 51/5237 |
| 2017/0102301 A1 | 4/2017 | Liu et al. | |

FOREIGN PATENT DOCUMENTS

| | | |
|---|---|---|
| CN | 102411099 A | 4/2012 |
| CN | 102809513 | 12/2012 |
| CN | 203745561 | 7/2014 |
| CN | 104344996 | 2/2015 |
| CN | 204330366 | 5/2015 |
| CN | 104729929 | 6/2015 |
| JP | 1998026644 | 1/1998 |
| JP | 2013127453 | 6/2013 |
| JP | 2016540991 | 12/2016 |
| KR | 100674825 | 1/2007 |
| KR | 101531177 | 6/2015 |
| KR | 101575055 B1 | 12/2015 |
| TW | 201326796 | 7/2013 |

OTHER PUBLICATIONS

Second Chinese Office Action for Application No. 201510991421.X dated Mar. 11, 2019, 8 pages.
Third Chinese Office Action for Application No. 201510991421.X dated May 24, 2019, 2 pages.
Search Report for Chinese Application No. 201510991421.X, 1 page.
Extended Search Report of Parallel European Patent Application No. 16877566.6, dated Dec. 3, 2018, 6 pages.
Korean Office Action for Application No. 10-2018-7017613, dated Mar. 29, 2019, 5 pages.
PCT Search Report for Application No. PCT/CN2016/108387, dated Jan. 26, 2017, 2 pages.
Search Report for Application No. 105140644, dated Aug. 24, 2017, 4 pages.
Search Report & First Office Action for Chinese Patent Application No. 201510991421.X, dated Nov. 26, 2018, 7 pages.

\* cited by examiner

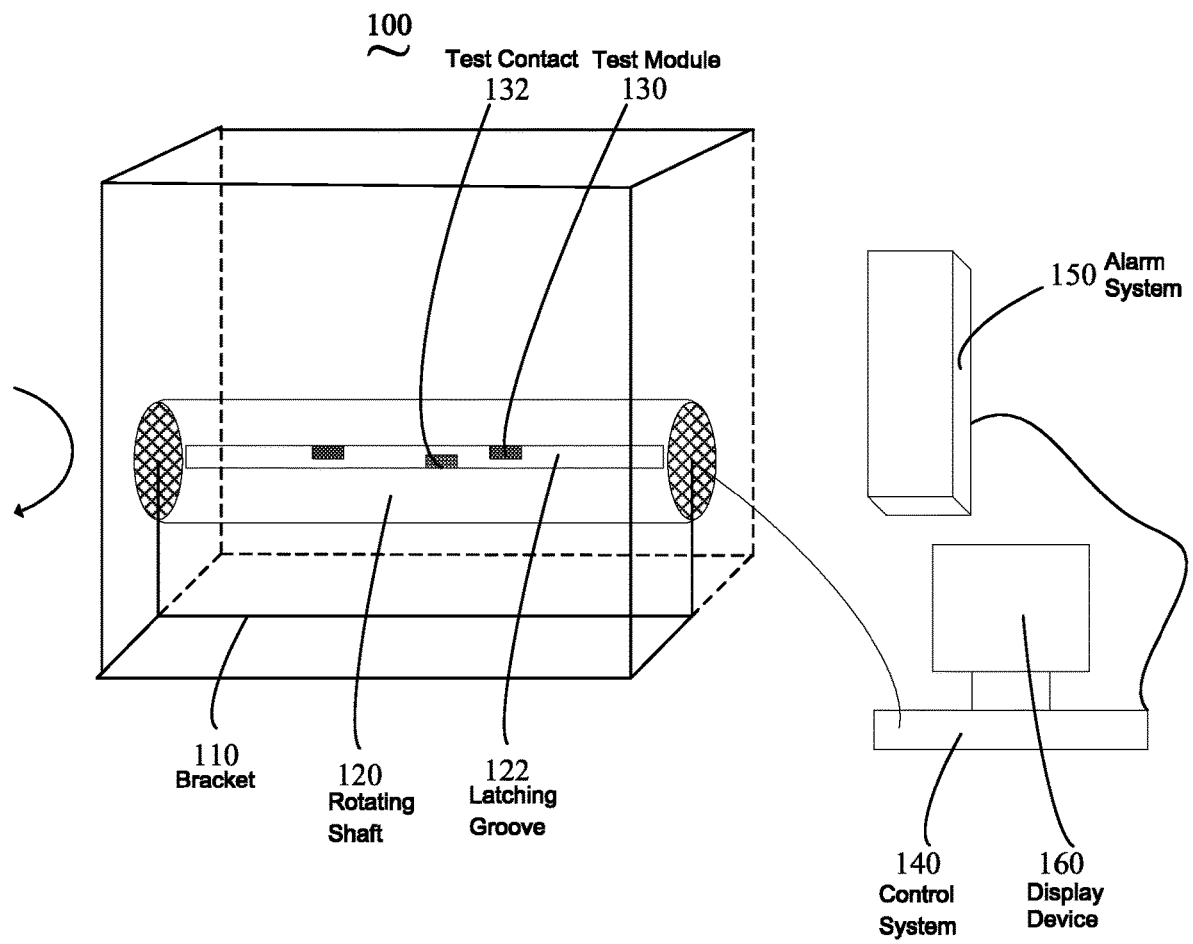

RELIABILITY TEST FIXTURE FOR FLEXIBLE DISPLAY COMPONENT AND ONLINE RELIABILITY TEST DEVICE FOR FLEXIBLE DISPLAY COMPONENT

CROSS REFERENCE TO RELATED APPLICATIONS

This is a National Stage application of PCT/CN2016/108387, filed Dec. 2, 2016, which claims priority to Chinese Patent Application No. 201510991421.X, filed Dec. 24, 2015, the disclosures of which are incorporated herein by reference in their entirety.

TECHNICAL FIELD

The present disclosure relates to the field of tests of reliability of flexible display components, and more particularly, to a test fixture for testing reliability of a flexible display component and an on-line test equipment for testing reliability of a flexible display component having the same.

BACKGROUND TECHNOLOGY

Most of the currently used test equipment for testing reliability of a flexible display component can only be informed of the test results after the test is finished. However, if it cannot be combined with an on-line equipment, and there is no uniform test standards, the changing situation of the internal circuit cannot be sensed, such that the relationship between the test times and the failure of the internal circuit of the flexible display component cannot be accurately derived, thus a required database cannot be obtained.

SUMMARY

Therefore, it is necessary to provide a test fixture for testing reliability of a flexible display component, which can form an on-line test equipment for testing reliability of a flexible display component with an on-line equipment, thereby testing a changing situation of a flexible internal circuit.

A test fixture for testing reliability of a flexible display component includes a bracket and a rotating shaft rotatably mounted on the bracket. The rotating shaft defines a latching groove at a surface thereof along an axial direction configured to fix the flexible display component. The rotating shaft is provided with a test module therein configured to detect an electrical parameter of an internal circuit of the flexible display component. The test module has a test contact configured to be electrically coupled to the flexible display component.

In the aforementioned test fixture for testing reliability of the flexible display component, the flexible display component is fixed by the latching groove during test, and is electrically coupled to the test module. Thus, each time the rotating shaft curls the flexible display component, the test module can timely detect the electrical parameters of the internal circuit of the flexible display component after curling. The test fixture can form an on-line test equipment for testing reliability of the flexible display component with an on-line device, and then the changing situation of the internal circuit of the flexible display component can be tested in real time.

In one embodiment, the test module can include a current test module, a resistance detection module, or a capacitance detection module.

In one embodiment, the rotating shaft can be a hollow shaft, the latching groove is in communication with a hollow portion of the rotating shaft, and the test module is accommodated in the hollow portion.

In one embodiment, the rotating shaft can be a solid shaft, and the test module is accommodated in the latching groove.

In one embodiment, the rotating shaft has an adjustable rotation rate.

In one embodiment, the test fixture for testing reliability of the flexible display component further includes a power mechanism configured to drive the rotating shaft to rotate.

An on-line test equipment for testing reliability of a flexible display component is further provided, which includes the aforementioned test fixture, and a control system electrically coupled to the test module. The control system is configured to record a test value outputted by the test module.

In one embodiment, the test value can be a current value, a current frequency, a resistance value, or a capacitance value.

In one embodiment, the on-line test equipment for testing reliability of a flexible display component further includes an alarm system. The control system is configured to compare a test value after curling with a test value before curling outputted by the test module, when a number of times of curling of the display component reaches a predetermined number of times, if a test value variation is greater than or equal to a preset standard, the control system controls the alarm system to generate an alarm indicating being unqualified, and if the test value variation is less than the preset standard, the alarm system generates an alarm indicating being qualified.

In one embodiment, the on-line test equipment for testing reliability of a flexible display component further includes a display device. The control system is configured to compare a test value after curling with a test value before curling outputted by the test module, and control the display device to display a corresponding relationship between a number of times of curling and a test value variation.

BRIEF DESCRIPTION OF THE DRAWINGS

The attached FIGURE is a schematic view of an on-line test equipment for testing reliability of a flexible display component according to an embodiment.

DETAILED DESCRIPTION OF THE EMBODIMENTS

The above objects, features and advantages of the present invention will become more apparent by describing in detail embodiments thereof with reference to the accompanying drawings. Embodiments of the invention are described more fully hereinafter with reference to the accompanying drawings. The various embodiments of the invention may, however, be embodied in many different forms and should not be construed as limited to the embodiments set forth herein. Rather, these embodiments are provided so that this disclosure will be thorough and complete, and will fully convey the scope of the invention to those skilled in the art. Components that are identified using the same or similar reference characters refer to the same or similar components.

It will be understood that when an component is referred to as being "connected" or "coupled" to another component, it can be directly connected or coupled to the other component or intervening components may be present. In contrast, if a component is referred to as being "directly connected" or "directly coupled" to another component, there are no intervening components present.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. The term "and/or" as used herein includes any and all combinations of one or more of the associated listed items.

Preferred embodiments of the present disclosure will be described with reference to the accompanying drawings.

Referring to the FIGURE, the present disclosure provides an on-line test equipment 100 for testing reliability of a flexible display component configured to perform a test of reliability of the flexible display component. Specifically, electrical properties of an internal circuit of the flexible display component under different times of curling state are tested, and then the data such as the life and aging of the internal circuit are tested. The flexible display component herein should be understood in a broad sense, and is not limited to a complete flexible display screen, or it may be an component with a different number of functional layers during the flexible display screen manufacturing process.

Referring to the FIGURE, the on-line test equipment 100 for testing reliability of the flexible display component according to an embodiment includes a test fixture, the test fixture includes a bracket 110, a rotating shaft 120 mounted on the bracket 110, and a test module 130 disposed inside the rotating shaft 120.

The bracket 110 is configured to support a rotation of the rotating shaft 120. The structure of the bracket 110 can be determined in accordance with requirements, which can also be provided to be able to dock with a flow-line equipment.

The test fixture can further include a power mechanism configured to drive the rotating shaft 120 to rotate, such as a motor. The power mechanism can also be mounted on the bracket 110. The power mechanism can also be an accessory of the test fixture, selected and assembled by users themselves.

The rotating shaft 120 is a hollow shaft, and a hollow portion thereof is configured to accommodate the test module 130. The rotating shaft 120 defines a latching groove 122 along an axial direction on a surface thereof, which is radially in communication with the hollow portion. The latching groove 122 is configured to latch and fix the flexible display component (not shown).

The rotating shaft 120 is configured to curl the flexible display component during rotation, such that the test module 130 can test the electrical properties of the internal circuits of the flexible display component under a curled state. During testing, one end of the flexible display component is latched into the latching groove 122, and then the rotating shaft 120 is rotated to curl the flexible display component, and the test is performed by the test module 130, and then the rotating shaft 120 is reversely rotated to release the flexible display component. Afterwards, the rotating shaft 120 curls the flexible display component again and the test is performed, and repeatedly, the test module 130 can test the electrical parameters of the internal circuits of the flexible display component after each curling, such that the test module 130 can timely detect the changing situation of the flexible internal circuits.

The test module 130 is configured to be electrically coupled to a contact of the flexible display component after the flexible display component is inserted into the latching groove 122. The test module 130 is provided with a test contact 132 configured to be electrically coupled to the flexible display component. When the test module 130 is disposed in the hollow portion of the rotating shaft 120, the test contact 132 can be located in the latching groove 122, such that the test module 130 can be in contact with the contact of the flexible display component in the latching groove 122. The test contact 132 can also be located within the hollow portion of the rotating shaft 120, such that the test module 130 can be electrically coupled to the contact of the flexible display component in the hollow portion of the rotating shaft 120.

In addition, the rotating shaft 120 can also be a solid shaft, and the rotating shaft 120 defines a latching groove 122 extending along an axial direction only on the surface thereof. The test module 130 is accommodated in the latching groove 122, and is electrically coupled to the flexible display component after the flexible display component is inserted into the latching groove 122.

The test module 130 is configured to test the electrical parameters of the internal circuits of the flexible display component after curling. When the flexible display component performs the reliability test of the flexible display component, the object required to be detected are different functional layers, which are known as layers to be tested. The test typically includes a test of reliability of a flexible display component of a metal layer and a test of reliability of a flexible display component of a dielectric layer (e.g., a silicon nitride layer, a silicon oxide layer).

When the metal layer is curled, the metal layer may occur breakage, thereby causing the resistance to change. With the increase of the curling times, the degree of the breakage increases, the change of the resistance will gradually increase. When the metal layer is completely broken, an open circuit is then formed, and the resistance changes most at the time.

When the dielectric layer is curled, the dielectric layer may occur breakage, thereby causing the capacitance to change. With the increase of the degree of the breakage, the change of the capacitance will gradually increase. When the dielectric layer is completely broken, the capacitance changes most.

The test module 130 typically includes a resistance detection module, a capacitance detection module, and a current detection module, each of which can be provided with the aforementioned test contact 132, respectively, or can be provided with a common test contact 132. The resistance changes of the circuits of the metal layer can be directly detected by using the resistance detection module so as to detect a resistance change value, or by using the current detection module. The capacitance changes of the dielectric layer can be directly detected by using the capacitance detection module so as to detect a capacitance change value, or by using the current detection module.

Resistance and capacitance changes can be converted to current changes. Therefore, the current detection module can also be used to detect the current change of the circuit of the layer to be tested, thereby detecting the changing situation of the internal circuit. Resistance and capacitance changes can also be converted to other electrical signals, such as testing the change of the current frequency caused by the resistance and capacitance changes, and then detecting the changing situation of the internal circuits.

The resistance change of the metal layer can be detected directly using the resistance detection module or the current detection module. In general, when the circuit of the metal layer to be detected is thicker, since the resistance change is more obvious when the thicker circuit is bending, the resistance change is detected using the resistance detection module at this time. However, when the circuit of the metal layer to be detected is thin, since the resistance change may not be significant before and after its curling, and the direct detection using the resistance detection module may not be accurate, the current change caused by the curling is detected by using the current detection module.

Therefore, the changing situation of the internal circuit can be detected by using the test module 130. For example, the curling times when complete breakage can be obtained. In addition, the changing situation of the test value when the curling reaches a certain number of times can be obtained, thereby obtaining the degree of the breakage, i.e., obtaining its life and aging situation.

The on-line test equipment 100 for testing reliability of the flexible display component further includes a control system 140 electrically coupled to the test module 130, an alarm system 150 and a display device 160 connected to the control system 140. The control system 140 is an on-line equipment, which form a complete on-line test equipment with the test fixture. The alarm system 150 and the display device 160 are output devices configured to output test results.

The alarm system 150 is provided with a sounding device, a light emitting device, or a vibrating device and the like. These devices can be individually alarmed or all alarmed when alarm. The display device 160 can be used to display a test information, such as a corresponding relationship between the curling times of the flexible display component and a test value variation. When the parameters of the layer to be tested have occurred changes more than the standard, the control system 140 controls the alarm system 150 to alarm.

The test flow of the on-line test equipment 100 for testing reliability of the flexible display component is described below by taking the test of reliability of the flexible display component of the metal layer as an example.

When reliability of the flexible display component of the metal layer of the flexible display component is tested:

The flexible display component is latched into the latching groove 122 of the rotating shaft 120, and the contact of the metal layer for testing is electrically coupled to the test contact 122. The test module 130 is a current detection module. After the current detection module is electrically coupled to flexible display component, the current of the circuit to be tested flowing through the metal layer is started to test in real time.

Afterwards, the rotating shaft 120 is driven to rotate, such that the flexible display component is wound on the rotating shaft 120. Herein, it should be noted that, firstly, the shape and radius of the rotating shaft 120 can be determined in accordance with the curl curvature of the flexible display component, and the rotation rate of the rotating shaft 120 is adjustable to meet the test requirements for different intensities. Secondly, the amount of the curling of the flexible display component is determined in accordance with the demand. It is not always necessary to wind the entire flexible display component on the rotating shaft 120, and the flexible display component can be curled only part of the length as required.

The rotating shaft 120 is reversely rotated to release the flexible display component, and then the rotating shaft 120 curls the flexible display component again and the test is performed. Repeatedly, the test module 130 can test the current flowing through the metal layer after each curling.

The control system 140 compares a test value after curling with a test value before curling outputted by the test module 130. When a curling times of the flexible display component reaches a predetermined times (if it is required to be curled for 300 times without breakage, the predetermined times is 300), if a test value variation is greater than or equal to a preset standard, it means that the degree of the breakage of the metal layer exceeds the acceptable standard, thus it can be determined that the curling capacity is not required, and the control system 140 controls the alarm system 150 to generate an alarm indicating being unqualified. If the test value variation is less than the preset standard, it is proved that the degree of the breakage is still within the acceptable standard although the metal layer is broken, thus the alarm system 150 generates an alarm indicating being qualified.

Alarms indicating the unqualified test and the qualified test can be achieved through different alarm methods, such as directly through different electronic voices to remind, or through different whistle ways to remind.

The output of the test result depends not only on the alarm device. In addition, the control system 140 displays the corresponding relationship between the curling times of the flexible display component and the test value variation on the display device 160, which is monitored by workers.

The aforementioned test flow is illustrated by taking the test performed by using the current detection module as an example, the test flow performed by using the resistance detection module is similar to that and will not be repeated. The test method for testing reliability of the flexible display component of the dielectric layer is similar to that of the metal layer, and will not be repeated.

In summary, the on-line test equipment 100 for testing reliability of the flexible display component of the present disclosure can detect the changing situation of the internal circuit of the flexible display component, and obtain the failure condition in a timely manner.

Although the respective embodiments have been described one by one, it shall be appreciated that the respective embodiments will not be isolated. Those skilled in the art can apparently appreciate upon reading the disclosure of this application that the respective technical features involved in the respective embodiments can be combined arbitrarily between the respective embodiments as long as they have no collision with each other. Of course, the respective technical features mentioned in the same embodiment can also be combined arbitrarily as long as they have no collision with each other.

The foregoing descriptions are merely specific embodiments of the present invention, but are not intended to limit the protection scope of the present invention. Any variation or replacement readily figured out by a person skilled in the art within the technical scope disclosed in the present invention shall all fall within the protection scope of the present invention. Therefore, the protection scope of the present invention shall be subject to the protection scope of the appended claims.

What is claimed is:

1. A test fixture for testing reliability of a flexible display component, comprising:
   a bracket; and
   a rotating shaft rotatably coupled to the bracket, the rotating shaft including:
      a latching groove disposed along an axial direction on a surface of the rotating shaft and adapted to couple the flexible display component to the rotating shaft; and
      a test module disposed in the rotating shaft and adapted to detect an electrical parameter of an internal circuit of the flexible display component, the test module having a test contact electrically coupled to the flexible display component in the rotating shaft.

2. The test fixture of claim 1, wherein the test module is one of a current test module, a resistance detection module, and a capacitance detection module.

3. The test fixture of claim 1, wherein the rotating shaft includes a hollow portion, wherein the latching groove is in communication with the hollow portion, and wherein the test module is disposed in the hollow portion.

4. The test fixture of claim 1, wherein the rotating shaft is a solid shaft, and wherein the test module is disposed in the latching groove.

5. The test fixture of claim 1, wherein the rotating shaft has an adjustable rotation rate.

6. The test fixture of claim 1, further comprising a power mechanism adapted to drive the rotating shaft to rotate.

7. An on-line test equipment for testing reliability of a flexible display component, comprising:
   a test fixture comprising:
      a bracket; and
      a rotating shaft rotatably coupled to the bracket and comprising:
         a latching groove disposed along an axial direction on a surface of the rotating shaft and adapted to couple to the flexible display component; and
         a test module disposed in the rotating shaft and adapted to detect an electrical parameter of an internal circuit of the flexible display component, the test module having a test contact configured to be electrically coupled to the flexible display component; and
   a control system electrically coupled to the test module and adapted to record test values outputted by the test module.

8. The on-line test equipment of claim 7, wherein the test value is one of a current value, a current frequency, a resistance value, and a capacitance value.

9. The on-line test equipment of claim 7, further comprising an alarm system, wherein the control system is adapted to compare a first test value after curling with a second test value before curling to determine a test value variation; when a number of times of curling of the display component reaches a predetermined number of times, the control system controls the alarm system to generate an unqualified alarm if the test value variation is greater than or equal to a preset standard, and the alarm system generates a qualified alarm if the test value variation is less than the preset standard.

10. The on-line test equipment of claim 7, further comprising a display device, wherein the control system is adapted to compare a first test value after curling with a second test value before curling to determine a test value variation, and control the display device to display a corresponding relationship between a number of times of curling and the test value variation.

11. A method for testing reliability of a flexible display component, comprising:
   electrically coupling the flexible display component to a test contact of a test module located within a rotating shaft by latching the flexible display component into a latching groove of the rotating shaft;
   curling the flexible display component by rotating the rotating shaft in a first direction;
   releasing the flexible display component by rotating the rotating shaft in a second direction; and
   testing electrical parameters of the flexible display component by the test module.

12. The method of claim 11, wherein
   the test contact is located in the latching groove.

13. The method of claim 11, wherein
   the test contact is located within a hollow portion of the rotating shaft.

14. The method of claim 11, further comprising an alarm step, wherein a control system is adapted to compare a first test value after curling with a second test value before curling to determine a test value variation; and when a number of times of curling of the display component reaches a predetermined number of times, if the test value variation is greater than or equal to a preset standard, an unqualified alarm is performed, and if the test value variation is less than the preset standard, a qualified alarm is performed.

* * * * *